United States Patent [19]
Byrne

[11] Patent Number: 5,369,299
[45] Date of Patent: Nov. 29, 1994

[54] TAMPER RESISTANT INTEGRATED CIRCUIT STRUCTURE

[75] Inventor: Robert C. Byrne, Sunnyvale, Calif.

[73] Assignee: National Semiconductor Corporation, Santa Clara, Calif.

[21] Appl. No.: 96,537

[22] Filed: Jul. 22, 1993

[51] Int. Cl.$^5$ .................. H01L 29/34; H01L 21/465
[52] U.S. Cl. .................. 257/638; 257/704; 257/758; 257/760; 257/769; 257/907; 257/922; 437/228; 437/235; 437/245
[58] Field of Search .............. 257/638, 758, 760, 769, 257/907, 704, 922; 437/228, 235, 245

[56] References Cited

U.S. PATENT DOCUMENTS 4,030,952 6/1977 Luce et al. .
5,109,267 4/1992 Koblinger et al. .................. 257/760

FOREIGN PATENT DOCUMENTS 61-51950 3/1986 Japan .
63-170944 7/1988 Japan .

*Primary Examiner*—Edward Wojciechowicz
*Attorney, Agent, or Firm*—Skjerven, Morrill, MacPherson, Franklin and Friel

[57] ABSTRACT

A tamper resistant structure has a pattern which covers portions of an IC but exposes other portions of the IC so that etching away the tamper resistant structure destroys the exposed portions. The IC can not be easily disassembled and reverse engineered because the tamper resistant structure hides active circuitry and removing the tamper resistant structure destroys active circuitry. One embodiment of the tamper resistant structure includes a metal layer and a cap layer. The cap layer typically includes material that is difficult to remove, such as silicon carbide, silicon nitride, or aluminum nitride. The metal layer typically includes a chemically resistant material such as gold or platinum. A bonding layer of nickel-vanadium alloy, titanium-tungsten alloy, chromium, or molybdenum, may be used to provide stronger bonds between layers. Some embodiments provide an anti-corrosion seals for bonding pads in addition to the tamper residant structure. The seals and tamper resistant structures are formed using the same materials and processing steps. The choice of pattern which covers and exposes different portions of the IC can be random or tailored to the active circuitry. The pattern can be the same for every chip or different for every chip formed from a wafer.

19 Claims, 4 Drawing Sheets

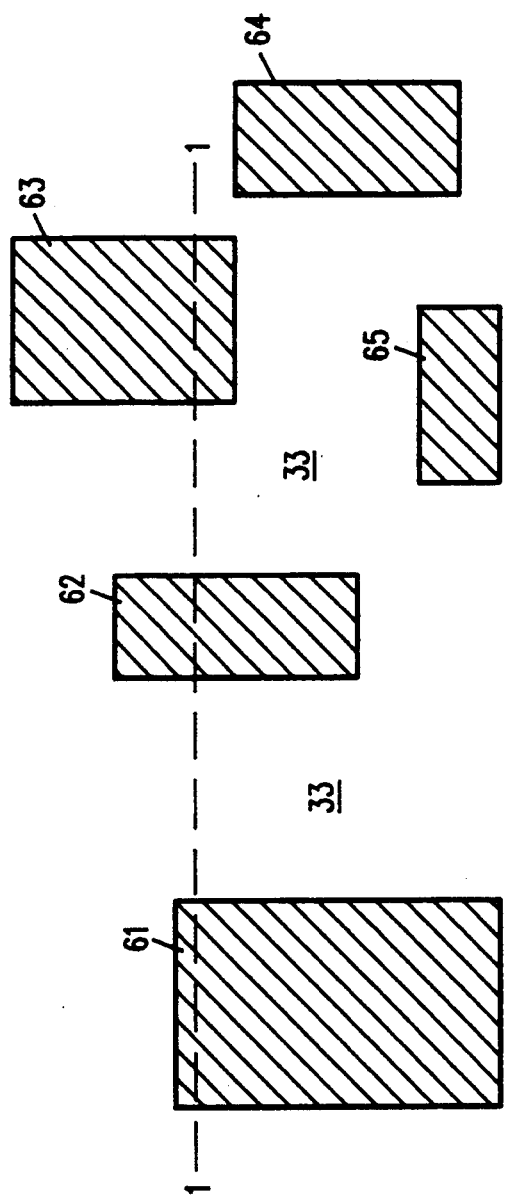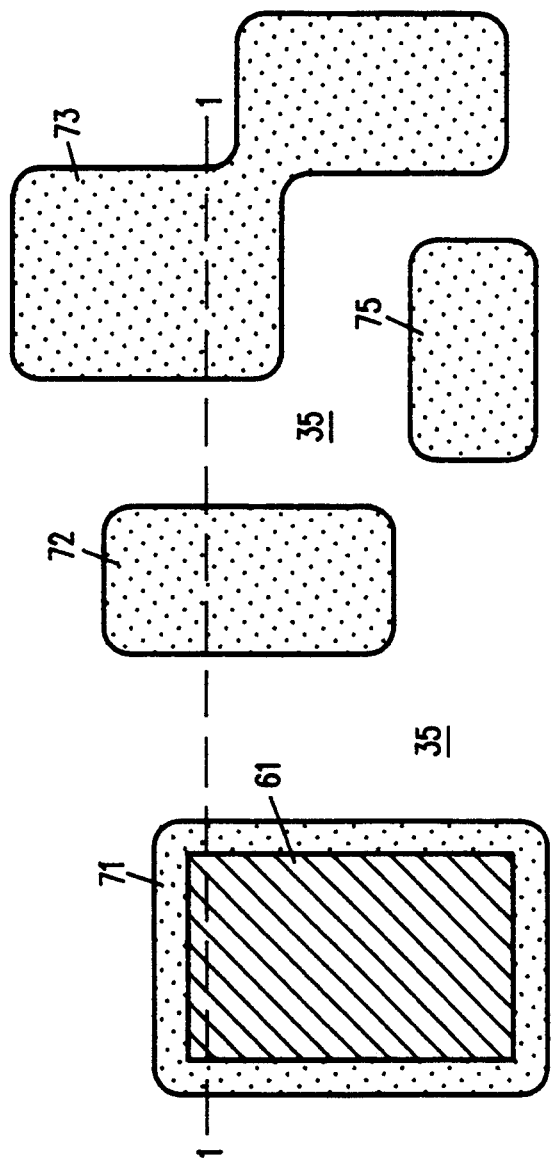
FIG. 2A
FIG. 2B

TAMPER RESISTANT INTEGRATED CIRCUIT STRUCTURE

CROSS-REFERENCES TO RELATED APPLICATIONS

This application is related to, and incorporates by reference, the U.S. pat. application Ser. No. 08/096,537 entitled "STRUCTURES FOR PREVENTING REVERSE ENGINEERING OF INTEGRATED CIRCUITS", filed on the same date as the present application.

BACKGROUND OF THE INVENTION

1. Field of the Invention

This invention relates to structures which prevent tampering with or reverse engineering of integrated circuits.

2. Description of Related Art

Integrated circuit (IC) manufacturers and users have several reasons for wanting to protect the contents of ICs. Some manufacturers would like to stop reverse engineering and copying of circuit designs. Some users would like to prevent copying or changing of software and information stored in ICs. In either case, there is a need to provide structures on ICs that make disassembly and reverse engineering more difficult.

One method of reverse engineering is successively removing layers from an IC and examining the structure of each layer as it is exposed. Since adjacent layers in a IC often have different chemical properties, chemical processes can be chosen that remove the top layer but leave underlying layers intact. In this way, the layers of an IC can in effect be peeled off and the IC's structure determined.

Stored information can also be determined by disassembling an IC either determining structure or measuring stored charge. In EPROMs, E²PROMS, and similar ICs, information and software is stored as trapped electrical charge. If layers of an IC can be removed without significantly changing trapped charges, the information or software contained in the IC can be copied or changed.

The prior art has not provided a tamperproof IC which prevents reverse engineering or tampering with stored information. Structures are needed which make reverse engineering of ICs and tampering with ICs more difficult.

SUMMARY OF THE INVENTION

Embodiments according to the present invention provide tamper resistant structures which make it more difficult to tamper with or reverse engineer integrated circuits.

In one embodiment of the present invention, a tamper resistant structure is provided on a passivation layer of an IC and includes a metal layer and a cap layer formed in a pattern which exposes portions of the passivation layer.

Typically, the cap layer has a thickness and chemical composition that is more difficult to remove than are the exposed portions of passivation, so that removal of the cap layer also removes portions of the passivation layer and exposes underlying active circuitry. One type of the cap layer includes material that is difficult to remove, such as silicon carbide, silicon nitride, or aluminum nitride. Another type of cap layer has the same chemical composition as the passivation layer but is thicker than the passivation layer.

Typically, the metal layer has a thickness and chemical composition that make the metal layer etch more slowly than do metal traces in active circuitry. Removal of the cap layer exposes metal traces beneath the exposed portion of passivation. Removal of the metal layer destroys the exposed metal traces. Accordingly, removal of the tamper resistant structure destroys portions of active circuitry and makes reverse engineering more difficult.

The metal layer typically includes a noble metal such as gold or platinum but can also include a bonding layer made from a material which provides a stronger bond to the passivation layer such as a nickel-vanadium alloy, a titanium-tungsten alloy, chromium, or molybdenum.

In another embodiment of the present invention, the pattern of the tamper resistant structure includes a random distribution of regions with exposed portions of passivation between the regions. Alternatively, any convenient pattern can be used, or the pattern can be tailored for the active circuitry protected. The size of covered regions in the pattern should be larger than the feature size of the IC but not large enough to interfere with the operation of active circuitry.

The tamper resistant structures according to the embodiments of the present invention are typically formed on a wafer from which several ICs are formed. The same pattern of tamper resistant structure can be provided for every IC formed from the wafer or different patterns can be provided for every IC formed.

Still another embodiment of the invention provides a seal for bonding pads to prevent corrosion. The seal is formed using the same materials and processing steps as are used to form the tamper resistant structures.

This invention will be more fully understood in view of the following detailed description taken together with the drawings.

BRIEF DESCRIPTION OF THE DRAWINGS

FIG. 2A shows the pattern of a metal layer according to an embodiment of the present invention.

FIG. 2B shows a top view of the tamper resistant integrated circuit shown in FIG. 1.

DETAILED DESCRIPTION OF THE PREFERRED EMBODIMENTS

Particular embodiments of the present invention prevent tampering or reverse engineering of ICs by providing tamper resistant structures which are difficult to remove without also destroying portions of underlying circuitry. In one embodiment, a tamper resistant structure is formed on the surface of the IC in a pattern that leaves portions of the surface exposed. In other embodiments, the structure is provided between active layers in the IC and has a pattern with openings to underlying layers. The structure contains a material that is chemically similar to the underlying layer, so that removal of the structure destroys the exposed portions of the IC.

Reverse engineering is more difficult because portions of the IC are destroyed as the tamper resistant structure is removed.

Figure 1:
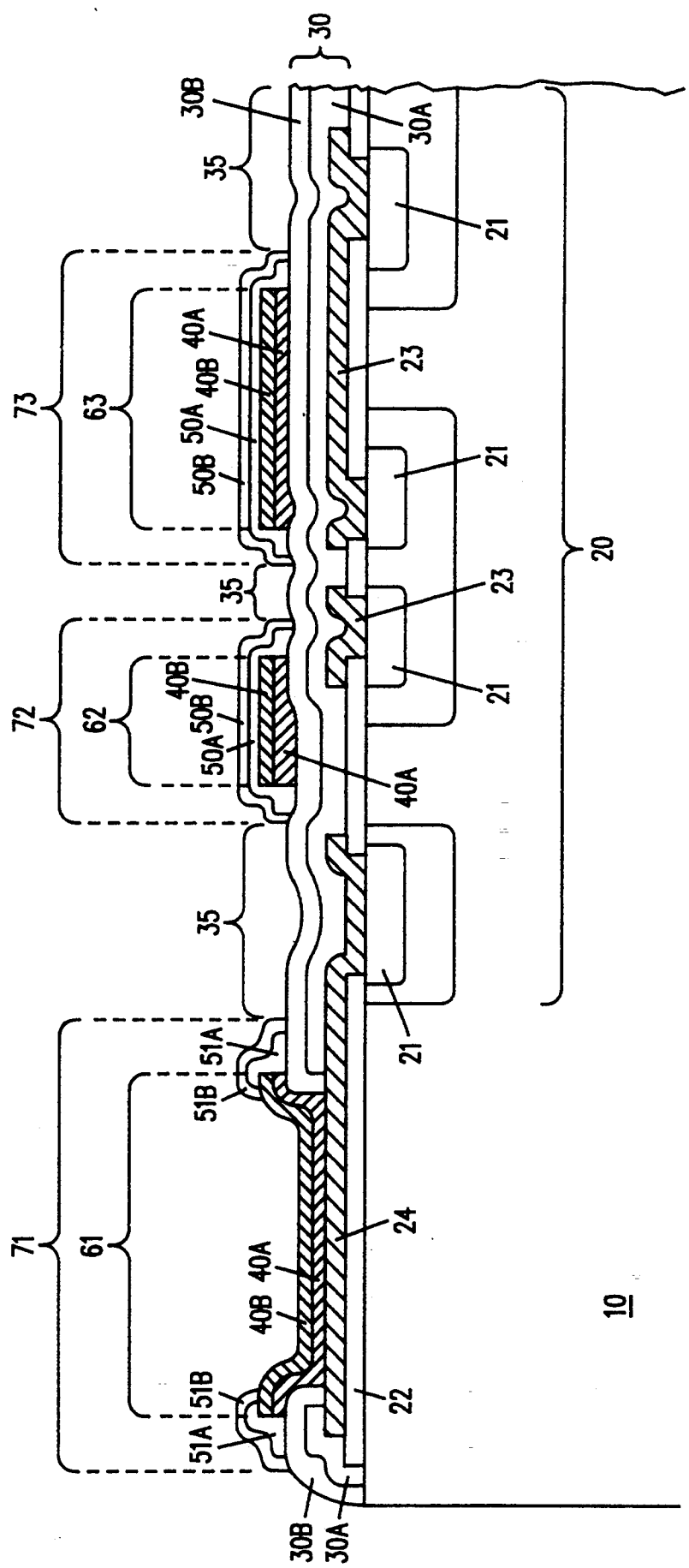
FIG. 1 shows a cross-sectional view of a tamper resistant integrated circuit according to an embodiment of the present invention.

FIG. 1 shows a cross-sectional view of a tamper resistant IC according to one embodiment of the present invention. The IC is formed on a semiconductor substrate 10. The remainder of this disclosure is restricted to the case where the IC is manufactured using silicon technology and semiconductor substrate 10 is silicon. As will be appreciated by those skilled in the art, other materials such as germanium or gallium-arsenide and other related IC fabrication technologies can be used in other embodiments of the present invention.

Active circuitry 20 may be formed in the substrate 10 and in layers overlying the substrate 10 using MOS, CMOS, bipolar, or other appropriate technologies. Active circuitry 20 includes doped regions 21, insulating layers 22, and conducting traces 23.

Doped regions 21 may be formed in the substrate 10, as shown in FIG. 1, or formed in overlying epitaxial layers. Insulating regions 22 and conducting traces 23 electrically isolate or connect the circuit elements in active circuitry 20. Insulating regions 22 are silicon dioxide, although other insulating materials, such as silicon nitride or silicon carbide, can also be used. The conducting traces 23 are aluminum. Other conductors including metals and doped polycrystalline silicon can be used for traces 23.

The embodiment shown in FIG. 1 is illustrative only. The precise form of active circuitry 20 is not crucial to this invention, because the tamper resistant structures overlie but do not significantly react with active circuitry. Disclosed tamper resistant structures are generally applicable to known or yet to be developed IC technology.

Overlying the active circuitry 20 is a passivation layer 30 which protects active circuitry 20 from scratches and contamination. Passivation layers are typically made of materials, such as silicon dioxide, silicon nitride, oxynitride mixtures, or other materials which are scratch resistant electrical insulators that provide a moisture and contaminant barrier. In FIG. 1, the passivation layer 30 is actually two layers a silicon dioxide layer 30A and an overlying silicon nitride layer 30B.

Passivation layer 30 has an opening for a bonding pad 24. Bonding pad 24 is electrically coupled to active circuitry 20 and provides an external connection for the IC. Overlying the bonding pad 24 and the passivation layer 30, and defining a number of discrete regions, is a metal layer 40 which is part of a tamper resistant structure. Metal layer 40 has two sub-layers, a bonding layer 40A and a gold layer 40B. Bonding layer 40A is typically made of a material such as a nickel-vanadium alloy, a titanium-tungsten alloy, chromium, molybdenum, tungsten, or another material which forms a strong bond with the passivation layer 30. Bonding layer 40A also inhibits diffusion of gold from layer 40B into the rest of the IC.

In the embodiment shown in FIG. 1, gold is used in layer 40B because gold is resistant to most chemical agents, is a good conductor, is relatively opaque to X-rays, and bonds well with gold bonding wires. Gold layer 40B may be replaced by another chemically resistant metal, such as platinum, or, as discussed more fully below, by the material used in traces 23.

Metal layer 40 can be formed using well known IC fabrication techniques such as sputtering or electrolysis and can then be masked and etched to create a pattern with openings that expose portions of the underlying layers. FIG. 2A shows a portion of a pattern for metal layer 40. Cross-section line 1—1 shows the relationship between the top views shown in FIGS. 2A and 2B and the cross-sectional view shown in FIG. 1. The pattern shown in FIG. 2A includes a number of regions 61-65. Between the regions 61-65 are exposed portions 33 of passivation layer 30.

Referring again to FIG. 1, a cap layer 50 is formed overlying passivation layer 30 and over metal layer 40. Cap layer 50 is etched to provide a pattern which leaves exposed portions 35 of passivation layer 30. Cap layer 50 has two sub-layers, a leveling layer 50A and a barrier layer 50B. Leveling layer 50A covers metal layer 40 and encapsulates metal regions 61-65. Leveling layer 50A is typically silicon dioxide, silicon nitride, or the same material as the passivation layer 30, but may be made from any material which is not removed by etches used to remove metal layer 40. Leveling layer 50A provides a smoother surface for bonding of barrier layer 50B.

Barrier layer 50B encapsulates leveling layer 50A but leaves exposed portions 35 of passivation layer 30. Barrier layer 50B is formed from chemically resistant material such as silicon carbide. Barrier layer 50B is difficult to remove without damaging passivation layer 30. Silicon carbide is chemically resistant, and most etches which remove silicon carbide remove the exposed portions 35 passivation layer 30 more quickly. Silicon carbide is also a hard material that is difficult to grind off, so that grinding the entire surface of the IC damages portions of passivation layer 30. The regions 71-73 and 75 can not be individually ground off because of their small size. Other materials which could be used in barrier layer 50B include silicon nitride, a nitride-carbide mixture, or aluminum nitride.

As an alternative cap layer 50, a structure made from the same material as passivation layer 30 can be used. If cap layer 50 is thicker than passivation layer 30, cap layer 50 takes longer to remove than does passivation layer 30. Etches which remove the thicker cap layer 50 also remove exposed portions of passivation layer 30 and may damage underlying active circuitry.

Cap layer 50 can be formed using conventional IC fabrication techniques. For example, leveling layer 50A can be formed over the surface of the IC using chemical vapor deposition followed by masking and etching to expose portions of passivation layer 30. Barrier layer 50B can then be formed over leveling layer 50A again using chemical vapor deposition followed by masking and etching to create a pattern.

FIG. 2B shows a top view of the IC shown in FIG. 1. The pattern formed by cap layer 50 includes regions 71-73 and 75. Region 71 is formed over the bonding pad 24 and has an opening provided which exposes part of metal region 61. Metal region 61 is in contact with bonding pad 24 and is provided for creating external electrical connections, for example through gold bonding wires which connect active circuitry 20 to I/O pins (not shown). Regions 61 and 71 also provide a protective seal for bonding pad 24. The protective seals keeps out moisture and prevents corrosion of bonding pad 24. A more complete description of the protective seal is disclosed in U.S. Pat. No. 5,136,364 to Robert C. Byrne which is incorporated herein by reference in its entirety.

Between regions 71-73 and 75 are exposed portions 35 of passivation layer 30. Regions 72, 73, and 75 have lengths and widths which are on the order of a few times, typically one to five times, the feature size in active circuitry 20. Because the size of the regions 61–65, 71–73, and 75 is large compared to the scale of the IC, alignment of masks to form metal regions 61–65 and cap regions 71–73 and 75 is not critical.

Regions 72, 73, and 75 encapsulate metal regions 62–65 so that regions 72, 73, and 75 must be removed before metal regions 62–65 can be attacked. Encapsulation prevents dissolving metal regions 62–65 to undermine cap regions 72, 73, and 75. Thus, cap regions 72, 73, and 75 can not be easily removed by removing the underlying metal layer first.

Figure 3:
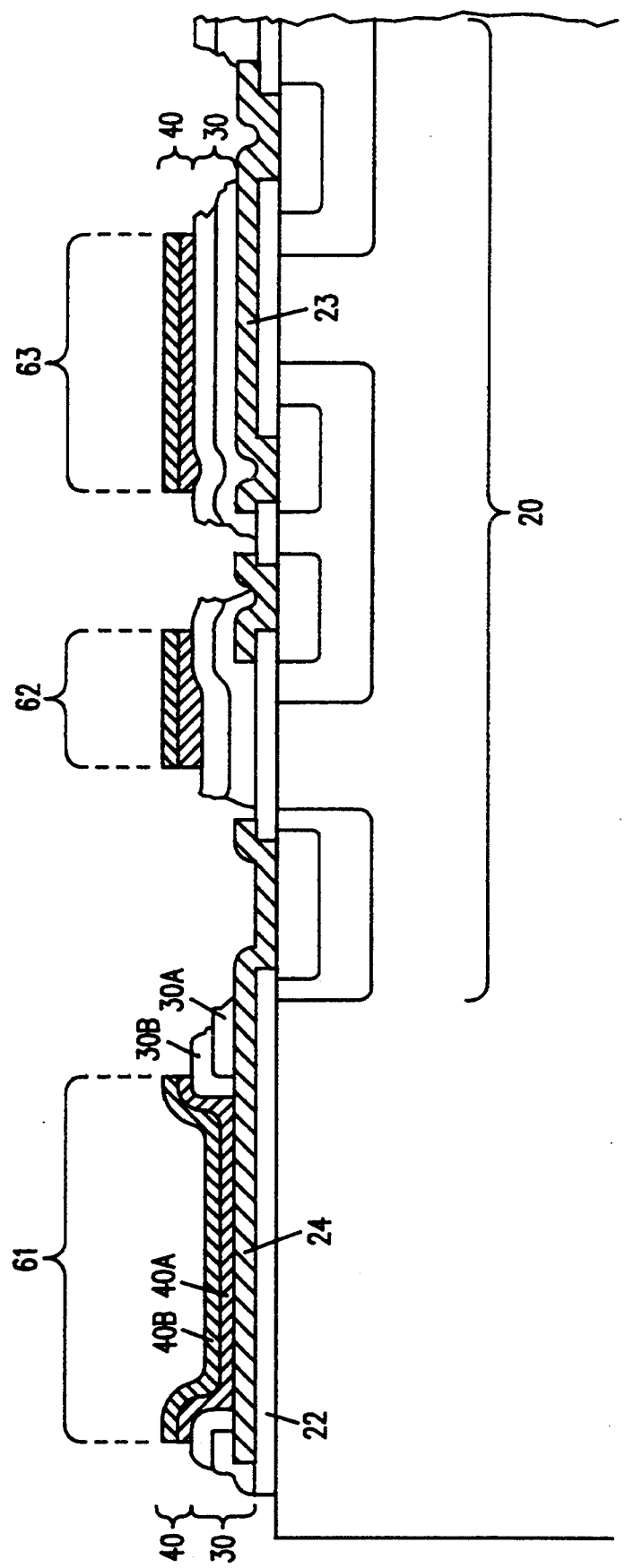
FIG. 3 shows a cross-sectional view of the tamper resistant integrated circuit of FIG. 1 after a chemical process to remove the cap layer.

FIG. 3 shows a cross-sectional view of the IC of FIG. 1 after etching to remove cap regions 71–73 and 75. As described above, cap regions 71–73 and 75 are made to be more difficult to etch than is the passivation layer 30, but of type of material that is attacked by etches which also attack passivation layer 30. Accordingly, as cap regions 71–73 and 75 are removed, exposed portions 35 of passivation layer 30 are removed, and portions of metal traces 23 which were underlying passivation layer 30 are exposed.

Elements of active circuitry 20 that are vulnerable to the etch used to remove cap regions 71–73 and 75, such as polycrystalline silicon conductors, resistors, fuses, or anti-fuses, may be destroyed. Thus, portions of circuitry and information stored by fuses or anti-fuses are destroyed. If a plasma etch is used to remove the cap regions 71–73 and 75, as would typically be used to remove silicon carbide, the plasma would change stored charge in the IC and destroy information in the IC which is stored in EPROM, E$^2$PROM, or flash ROM cells.

After removal of cap regions 71–73 and 75, portions of the active circuitry 20 are still covered by metal regions 61–65 and cannot be directly examined. X-ray observations are hindered by metal regions 61–65. Accordingly, the structure of the IC is difficult to completely determine even if the etching of cap regions 71–73 and 75 did not destroy any of active circuitry 20. Regions 61–65 typically must be removed to examine all of the active circuitry 20.

Figure 4:
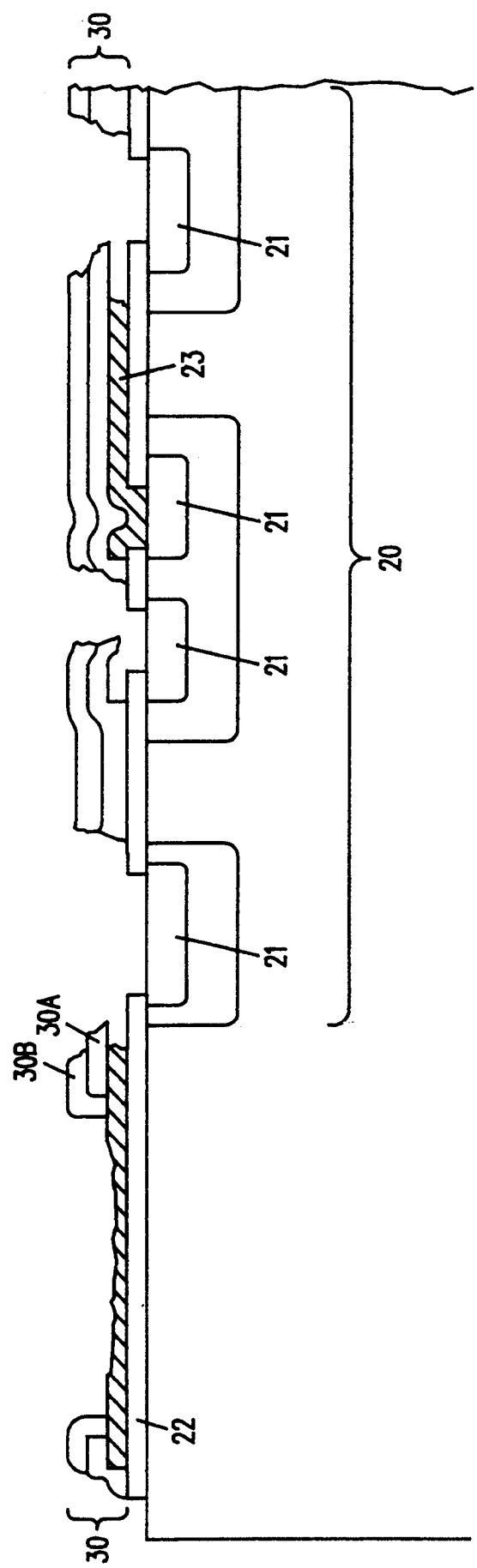
FIG. 4 shows a cross-sectional view of the tamper resistant integrated circuit of FIG. 3 after a chemical process to remove the metal layer.

The metal regions 61–65 each contain a portion of gold layer 40B. Gold is a relatively non-reactive metal and is difficult to remove. Two of the few known agents which effectively remove gold are aqua regia and cyanide. Both aqua regina and cyanide dissolve aluminum and many other metals more quickly than they dissolve gold. Accordingly, removal of the gold layer removes exposed portions of metal traces 23 and also removes portions of metal traces 23 from beneath the remaining portions of passivation layer 30. FIG. 4 shows a cross-sectional view of the IC of FIG. 3 after chemical removal of the metal regions 61–65.

Because the etch tunnels under passivation layer 30, etchant is difficult to remove. Later processing steps which heat the IC, for example to remove remaining portions of passivation layer 30, cause etchant left beneath passivation layer 30 to further dissolve traces 23.

An alternative to gold in metal layer 40 is the material used in metal traces 23. This has the disadvantage of not providing the corrosion protection that gold would provide. However, if metal layer 40 and traces 23 are made of the same material, etches which remove metal layer 40 also remove portions of traces 23. Metal layer 40 can be made thicker that traces 23 so that metal layer 40 takes longer to etch than do traces 23.

As shown in FIG. 4, after removal of the tamper resistant structure, large portions of active circuitry 20, particularly the metal traces 23, are destroyed. The IC is difficult to reverse engineer because the missing portions of active circuitry 20 are difficult or impossible to determine.

Referring again to FIG. 1, cap regions 72, 73, and 75 and metal regions 62–65 may be randomly distributed over active circuitry 20 or may be tailored to cover (or leave exposed) passivation which overlies critical portions of active circuitry 20. A typical pattern for the cap regions 71–73 and 75 would overlie between about 25% and 50% of active circuitry 20, so that a significant portion of passivation layer 30 above active circuitry 20 is exposed and a significant portion is covered.

The pattern of the tamper resistant structure can be a number of disjoint rectangles as shown in FIG. 2A, or any pattern that is convenient to mask and etch. Making metal regions 61–65 relatively small reduces the possible capacitive effects on underlying circuitry and also makes mechanical removal of individual regions in the pattern difficult.

In one embodiment, every ICs with the same active circuitry also has the same tamper resistant structure. With this embodiment, removal of the tamper resistant structure destroys the same portions of active circuitry on every IC. This embodiment may be vulnerable to reverse engineering which measures active circuitry that underlies the exposed portions of passivation layer in a first IC then measures active circuitry under the tamper resistant structure of a second IC. Measuring active circuitry under the tamper resistant structure may not be possible in some cases because etching to remove the metal layer tunnels under the tamper resistant structure, as described above.

In another embodiment, the pattern of the tamper resistant structure varies across the surface of a wafer so that when the wafer is divided into individual ICs, each IC has different portions of passivation exposed. Using this technique several IC must be disassembled to determine the structure of the IC. The cost of creating a different pattern for every chip on a wafer is about the same as the cost having identical patterns because masks are typically created for wafers rather than individual ICs.

Although the present invention has been described with reference to particular embodiments, the description is only an example of the invention's application and should not be taken as a limitation. The scope of the present invention is defined by the following claims.

I claim:

1. An integrated circuit comprising:
   active circuitry;
   a passivation layer overlying the active circuitry; and
   a tamper resistant structure formed on the passivation layer, the tamper resistant structure including:
   a metal layer disposed on the passivation layer and overlying portions of the active circuitry, the metal layer being electrically isolated from the active circuitry and having a pattern which exposes portions of the passivation layer; and
   a cap layer disposed on the metal layer, the cap layer having a pattern which covers portions of the metal layer but leaves portions of the passivation layer exposed, the cap layer having a chemical composition such that etches which attack the cap layer also attack the passivation layer.

2. The integrated circuit of claim 1, wherein the cap layer has a thickness and chemical composition such that etches applied to remove the cap layer also remove exposed portions of the passivation layer and expose portions of the active circuitry.

3. The integrated circuit of claim 2, wherein the cap layer has the same chemical composition as the passivation layer.

4. The integrated circuit of claim 3, wherein the cap layer is thicker than the passivation layer.

5. The integrated circuit of claim 2, wherein the cap layer comprises:
a leveling layer; and
a barrier layer overlying the leveling layer and formed from a material selected from a group consisting of silicon carbide, silicon nitride, and aluminum nitride.

6. The integrated circuit of claim 2, wherein:
the active circuitry comprises metal traces; and
the metal layer has a thickness and chemical composition such that etches which remove the metal layer also remove exposed portions of the metal traces.

7. The integrated circuit of claim 6, wherein the metal layer comprises;
a bonding layer which is bonded to the passivation layer; and
a chemically resistant layer overlying the bonding layer.

8. The integrated circuit of claim 7, wherein the chemically resistant layer comprises gold.

9. The integrated circuit of claim 8, wherein the bonding layer comprises a material selected from a group consisting of nickel-vanadium alloy, titanium-tungsten alloy, chromium, and molybdenum.

10. The integrated circuit of claim 9, further comprising:
a bonding pad in electrical contact with the active circuitry; and
a protective metal region in contact with the bonding pad, wherein the protective metal region has the same composition as the metal layer.

11. The integrated circuit of claim 10, further comprising an insulating region overlying the protective metal region, wherein the insulating region has the same composition as the cap layer.

12. The integrated circuit of claim 1, further comprising:
a bonding pad in electrical contact with the active circuitry; and
a protective metal region in contact with the bonding pad, wherein the protective metal region has the same composition as the metal layer.

13. The integrated circuit of claim 1, wherein the pattern of the metal layer is a substantially random distribution of rectangular regions.

14. The integrated circuit of claim 13, wherein the rectangular metal regions have length and width that are between one and five times a feature size in the active circuitry.

15. An integrated circuit comprising:
active circuitry;
a bonding pad in electrical contact with the active circuitry;
a protective layer covering the active circuitry and having an opening which exposes the bonding pad;
a metal diffusion barrier disposed on the protective layer and on the bonding pad, the diffusion barrier having a pattern which exposes portions of the protective layer, the pattern including a first region that is electrically isolated from the active circuitry and a second region in contact with the bonding pad;
a gold layer overlying the metal diffusion layer and having the same pattern as the metal diffusion layer; and
a cap layer overlying the gold layer, the cap layer having a chemical composition such that etches which attack the cap layer also attack the protective layer, the cap layer having a pattern which encapsulates portions of the gold layer but leaves a portion of the gold layer overlying the bonding pads exposed and leaves portions of the protective layer exposed.

16. A method for manufacturing a tamper resistant integrated circuit, comprising the steps of:
fabricating active circuitry on a semiconductor wafer;
forming a passivation layer which overlies and protects the active circuitry;
forming a metal layer overlying the passivation layer;
etching the metal layer to create a pattern of metal regions on the passivation layer, the metal regions being electrically isolated from the active circuitry and separated from each other so as to expose portions of the passivation layer;
forming a cap layer overlying the metal regions and the passivation layer, the cap layer having a chemical composition such that etches which attack the cap layer also attack the passivation layer; and
etching the cap layer to expose portions of the passivation layer.

17. The method of claim 16, further comprising separating the wafer into individual dies, wherein the pattern created by etching of the metal layer is substantially the same on every die.

18. The method of claim 16, further comprising separating the wafer into individual dies, wherein the pattern created by etching of the metal layer is substantially different on every die.

19. The method of claim 16, wherein:
the step of forming the active circuitry comprises forming a bonding pad;
the method further comprises creating an opening through the passivation layer to the bonding pad; and
the step of etching the metal layer comprises forming a metal region disposed in the opening and on a portion of the passivation layer surrounding the opening.

* * * * *